United States Patent
Akejima

(10) Patent No.: US 11,189,571 B2
(45) Date of Patent: Nov. 30, 2021

(54) ELECTRONIC CIRCUIT DEVICE AND METHOD OF MANUFACTURING ELECTRONIC CIRCUIT DEVICE

(71) Applicant: RISING TECHNOLOGIES CO., LTD., Yokohama (JP)

(72) Inventor: Shuzo Akejima, Yokohama (JP)

(73) Assignee: RISING TECHNOLOGIES CO., LTD., Yokohama (JP)

( * ) Notice: Subject to any disclaimer, the term of this patent is extended or adjusted under 35 U.S.C. 154(b) by 0 days.

(21) Appl. No.: 16/812,268

(22) Filed: Mar. 7, 2020

(65) Prior Publication Data

US 2021/0005555 A1 Jan. 7, 2021

Related U.S. Application Data

(63) Continuation of application No. PCT/JP2018/032904, filed on Sep. 5, 2018.

(30) Foreign Application Priority Data

Sep. 11, 2017 (JP) .............................. JP2017-174275

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 21/4853; H01L 21/4857; H01L 21/565; H01L 21/568;
(Continued)

(56) References Cited

U.S. PATENT DOCUMENTS 6,803,324 B2 * 10/2004 Ogawa ................ H01L 21/4846
257/669
7,514,636 B2 * 4/2009 Sasaki ................ H01L 23/3107
174/252
(Continued)

FOREIGN PATENT DOCUMENTS

CN 108780791 A 11/2018
EP 3339023 A1 6/2018
(Continued)

OTHER PUBLICATIONS

Chien-Fu Tseng, Chung-Shi Liu, Chi-Hsi Wu, and Douglas Yu, "InFO (Wafer Level Integrated Fan-Out) Technology", 2016 IEEE 66th Electronic Components and Technology Conference, USA, Electronic Components and Technology Conference, 2016, DOI 10.1109/ECTC.2016.65.
(Continued)

*Primary Examiner* — Vu A Vu
(74) *Attorney, Agent, or Firm* — Franklin & Associates International Inc; Matthew F. Lambrinos

(57) ABSTRACT

The electronic circuit device according to the present invention including the wiring layer 13 including a plurality of the metal wirings, the photosensitive resin layer 21 made of the photosensitive resin arranged on the wiring layer 13, and the first electronic circuit element 33 arranged in the photosensitive resin layer 21. In this electronic circuit device, a plurality of opening 41 for exposing a part of the wiring layer 13 is formed on the photosensitive resin layer 21, and further, together with three-dimensionally connected to the first electronic circuit element 33, the re-distribution layer 42 on the first electronic circuit element including a plurality of the metal wirings which is three-dimensionally connected via a plurality of openings to a part of the wiring layer 13,
(Continued)

and the first external connection terminal 51 connected to the re-distribution layer 42 are formed.

17 Claims, 11 Drawing Sheets

(51) Int. Cl.
| | |
|---|---|
| H01L 21/56 | (2006.01) |
| H01L 21/683 | (2006.01) |
| H01L 23/31 | (2006.01) |
| H01L 23/00 | (2006.01) |
| H01L 25/10 | (2006.01) |
| H01L 25/00 | (2006.01) |
| H05K 1/02 | (2006.01) |
| H05K 1/09 | (2006.01) |
| H05K 1/11 | (2006.01) |
| H05K 3/46 | (2006.01) |

(52) U.S. Cl.
CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/105* (2013.01); *H01L 25/50* (2013.01); *H05K 1/0298* (2013.01); *H05K 1/09* (2013.01); *H05K 1/115* (2013.01); *H05K 3/4658* (2013.01); *H01L 2221/68372* (2013.01); *H01L 2221/68386* (2013.01); *H01L 2224/214* (2013.01); *H01L 2225/1035* (2013.01); *H01L 2225/1058* (2013.01); *H05K 2203/1322* (2013.01); *H05K 2203/1453* (2013.01)

(58) Field of Classification Search
CPC ............. H01L 21/6835; H01L 23/3128; H01L 23/5383; H01L 23/5386; H01L 24/19; H01L 24/20; H01L 25/105; H01L 25/50; H01L 2221/68372; H01L 2221/68386; H01L 2224/214; H01L 2225/1035; H01L 2225/1058; H01L 21/486; H01L 23/49816; H01L 2221/68345; H01L 2221/68359; H01L 2224/16225; H01L 2224/18; H01L 23/12; H05K 1/0298; H05K 1/09; H05K 1/115; H05K 3/4658; H05K 2203/1322; H05K 2203/1453; H05K 3/00; H05K 3/46
USPC ........................................................ 438/107
See application file for complete search history.

(56) References Cited

U.S. PATENT DOCUMENTS

| | | | |
|---|---|---|---|
| 8,643,164 | B2 | 2/2014 | Kaufmann et al. |
| 9,318,429 | B2 | 4/2016 | Hu et al. |
| 9,595,482 | B2 | 3/2017 | Chen |
| 10,354,964 | B2 | 7/2019 | Yu et al. |
| 2007/0052067 | A1 | 3/2007 | Umemoto |
| 2009/0000114 | A1 | 1/2009 | Rao et al. |
| 2010/0213599 | A1 | 8/2010 | Watanabe et al. |
| 2013/0157419 | A1 | 6/2013 | Shimizu et al. |
| 2015/0194388 | A1 | 7/2015 | Pabst et al. |
| 2017/0025380 | A1 | 1/2017 | Zhai et al. |
| 2017/0287874 | A1 | 10/2017 | Fang et al. |
| 2018/0130745 | A1 | 5/2018 | Hu et al. |
| 2019/0043835 | A1 | 2/2019 | Lee et al. |
| 2021/0082828 | A1 | 3/2021 | Akejima |
| 2021/0084762 | A1 | 3/2021 | Akejima |

FOREIGN PATENT DOCUMENTS

| | | |
|---|---|---|
| JP | H11233678 A | 8/1999 |
| JP | 2005183548 A | 7/2005 |
| JP | 2007067216 A | 3/2007 |
| JP | 2010219489 A | 9/2010 |
| JP | 2013-128060 | 6/2013 |
| JP | 2013236105 | 11/2013 |
| JP | 2015-56458 | 3/2015 |
| JP | 2019033245 A | 2/2019 |
| TW | I606563 A | 10/2017 |
| WO | 2010/101163 | 9/2010 |
| WO | 2019049899 A1 | 3/2019 |
| WO | 2020208984 A1 | 10/2020 |
| WO | 2020230442 A1 | 11/2020 |
| WO | 2020250795 A1 | 12/2020 |

OTHER PUBLICATIONS

Written Opinion of the International Searching Authority dated Oct. 30, 2018 for the PCT application No. PCT/JP2018/032904.
International search report dated Oct. 30, 2018 for the PCT application No. PCT/JP2018/032904.
Office Action dated Jan. 14, 2021 issued in TW Appl. No. 109112166 . English translation attached.
ISR for PCT/JP2020/011640, dated May 26, 2020. English translation attached.
WO-ISA for PCT/JP2020/011640, dated May 26, 2020.
WO-ISA for PCT/JP2020/022096 , dated Sep. 8, 2020.
ISR for PCT/JP2020/009810, dated Jun. 23, 2020. English translation attached.
WO-ISA for PCT/JP2020/009810, dated Jun. 23, 2020.
Masaaki Ishida et al., "Electromagnetic Shielding Technologies for Semiconductor Packages" TOSHIBA review, pp. 7p-10p, vol. 2, 2012. Cited in the specification of PCT/JP2020/022096. English machine translation attached.
Sheng-Chi Hsieh, Fu-Cheng Chu, Cheng-Yu Ho and Chen-Chao Wang, "Advanced Thin-Profile Fan-Out with Beamforming Verification for 5G WidebandAntenna", 2019 IEEE 69th Electronic Components and Technology Conference, USA, Electronic Components and Technology Conference, 2019, DOI 10.1109/ECTC.2019.00153. Cited in the specification of PCT/JP2020/022096.
ISR for PCT/JP2020/022096, dated Sep. 8, 2020. English translation attached.

\* cited by examiner

ELECTRONIC CIRCUIT DEVICE AND METHOD OF MANUFACTURING ELECTRONIC CIRCUIT DEVICE

CROSS REFERENCE TO RELATED APPLICATIONS

This application is a continuation of International Patent Application No. PCT/JP2018/032904, filed on Sep. 5, 2018. This application is based upon and claims the benefit of priority from the prior Japanese Patent Application No. 2017-174275 filed on Sep. 11, 2017 and PCT Application No. PCT/JP2018/032904, filed on Sep. 5, 2018, the entire contents of which are incorporated herein by reference.

FIELD

The present invention relates to an electronic circuit device, a support member of the electronic circuit device, an electronic information terminal, and a method of manufacturing the electronic circuit device. In particular, the present invention relates to a semiconductor device that incorporate three-dimensional fan-out wafer level package at low costs and a method of manufacturing thereof.

BACKGROUND

Conventionally, wafer level packages have been practically used. In this wafer level package, a re-distribution layer including one or plurality of wirings is formed on the semiconductor wafer on which a large number of independent integrated circuits are formed. After forming an external electrode of solder balls or the like on the wafer level package, the wafer level package is individualized into a plurality of integrated circuit units by a dicing saw.

In such conventional wafer level packages, the package area and the semiconductor chip on which the integrated circuit is formed are substantially the same area. As a result, there were problems that the number of terminals that can be mounted is limited when the chip area is small. In particular, this problem is remarkable in Logic LSIs including Micro Processor Unit (MPU) and Graphic Processor Unit (GPU) that input and output multi-bit parallel data at high speed. In many cases, Logic LSI is constituted by Application-Specific Integrated Circuits (ASIC). The application processor that operates various applications in the portable communication terminals and the baseband processor that performs digital signal processing of signals related to transmission and reception are the examples of such Logic LSIs.

Recently, Fan Out Wafer Level Package (FOWLP) has been proposed. This allows the area of the packages that can be re-distribution to be larger than the area of the semiconductor chip and the terminals can be extended to the outer resin molding part of the chip. As a result, it is suitable for the applications where the number of terminal is large compared with the chip area.

In FOWLP, instead of forming the package only on the wafer as in the conventional wafer-level packages, the integrated circuit elements are rearranged on the base substrate prepared in advance to form dummy wafers or dummy panels. Further, re-wiring is formed on the dummy wafer or the dummy panel. Metal or glass plates with rigidity are used for base substrate. Thus, although the number of semiconductor devices formed at one time is limited by the size of the base substrate, it does not dependent on the size of the wafer on which the integrated circuit is formed. In general, more semiconductor devices can be formed simultaneously than conventional wafer-level packages.

In the FOWLP, unlike the conventional packages, the re-distribution layer that provides the wiring from the terminal of the chip is made by "semiconductor process" (the process similar to the wiring layer of the semiconductor device, and the wiring pitch is about several micrometers to several tens of micrometers.) and connected to an external terminal. Furthermore, unlike the conventional general semiconductor packages, there is no package substrate. Therefore, the package is thin, and since the wiring length is shortened, the inductance and the floating capacitance are also reduced, and a high transmission rate of signals can be realize. It is also expected that the manufacturing cost will be reduced because no package substrate is used.

FIG. 11 shows the cross sectional view of the FOWLP 101. A semiconductor chip 102 is surrounded by a resin 103. The surface of the integrated circuit of the semiconductor chip 102 on which the electrode pads are formed and the surface of the resin 103 are flush with each other.

The re-distribution layer 104 is formed in contact with the surface of the integrated circuit of the semiconductor chip 102 on which the electrode pads are formed and the surface of the resin 103. The re-distribution layer 104 includes a plurality of metal re-distribution layers 105. Between the metal re-distribution layers 105 located in the different layers, and between the metal re-distribution layer 105 and the electrode pad of the semiconductor chips 102 are electrically connected by the photo via 106.

An insulation layer 107 is selectively formed on the surface of the re-distribution layer 104 opposite to the semiconductor chip 102, and a part of the metal re-distribution layer 105 is exposed in the area where the insulation layer 107 is not formed. A solder ball 108 corresponding to the external electrode is formed on the exposed part.

The FOWLP 101 configured as described above is a fan-out type in which the external electrodes are arranged in an area larger than the chip area, it is suitable for application processors and a baseband processor. Further, since no package board is used, the whole package is thin; and since the wiring length is shortened, the inductance and the floating capacitance are also reduced, and therefore a high transmission rate of signals can be realize. The manufacturing cost is also reduced because no package substrate is used.

Also in the FOWLP 101, the three-dimensional structure in which a plurality of chips are stacked is desired. This is because the mounting area can be reduced by three-dimensional arrangement. In particular, the application processor does not operate by itself, but operates by externally attached large capacity Dynamic Random Access Memory (DRAM) or flash memory. It is desirable for the application processors to communicate large amounts of data with a wide range of data buses with non-specialized standard packages of stacked DRAM and Flash memories.

However, it is difficult to modify the FOWLP 101 to the one with three-dimensional arrangement. The methods using a high embedded pillar or the like formed by metal plating in the wafer process have been devised, but this method is expensive. The low-cost and simplified processes has been required for three-dimensional arrangement, however such processes has not been established so far.

It has been examined to achieve three-dimensional stacking with the semiconductor chip 102 at the stage of forming the resin 103, by forming an embedded pillar having a long (high) pillar length, exposing the embedded pillar on the side of the resin 103 opposite to the metal re-distribution layer 105, and connecting another semiconductor package to the exposed embedded pillar.

SUMMARY

The electronic circuit device according to an embodiment of the present invention is characterized by including a wiring layer including a plurality of metal wirings, a photosensitive resin layer arranged on the wiring layer, the photosensitive resin layer being made from photosensitive resin, and a first electronic circuit element arranged in the photosensitive resin layer.

The photosensitive resin layer covering the first electronic circuit element has a plurality of opening exposing a part of the wiring layer. The wiring layer is three-dimensionally connected to a re-distribution layer arranged on the first electronic circuit element through the plurality of openings.

A transparency rate of the photosensitive resin is preferably 85% or more at a wavelength of 350 nm or more.

The photosensitive resin is preferably exposed at an exposure amount of 800 mJ/cm$^2$ or more and 2600 mJ/cm$^2$ or less.

A Young's modulus of the photosensitive resin is preferably 1 GPA or less at room temperature, and 0.1 GPA or less at 125° C.

An opening diameter of each of the plurality of openings is preferably larger than an opening diameter of each of interlayer connection holes made in the re-distribution layer arranged on the first electronic circuit element.

A method of manufacturing the electronic circuit device according to an embodiment of the present invention, the method includes forming a plurality of second external connection terminals connected to the wiring layer, and mounting a second electronic circuit element connected to the wiring layer by the second external connection terminal.

The method further includes forming a plurality of openings in the photosensitive resin layer by selectively irradiating ray, the plurality of openings exposing a part of the wiring layer, forming a re-distribution layer on the first electronic element, the re-distribution layer including a plurality of metal wirings, the re-distribution layer three-dimensionally connected to the first electronic circuit element and the part of the wiring layer through the plurality of openings and forming a plurality of first external connection terminals connected to the re-distribution layer.

The method further includes forming a plurality of second external connection terminals connected to the wiring layer, and mounting a second electronic circuit element connected to the wiring layer by the second external connection terminal.

The selectively irradiating ray is preferably conducted by selectively scanning a light beam.

The forming the wiring layer and the re-distribution layer include each of the plurality of metal wirings is preferably formed of a plurality of copper wirings surrounded by an insulation film.

The forming the plurality of openings preferably includes forming the opening larger than the opening diameter of an interlayer connection hole in the re-distribution layer on the first electronic circuit element.

DESCRIPTION OF EMBODIMENTS

Figure 1:
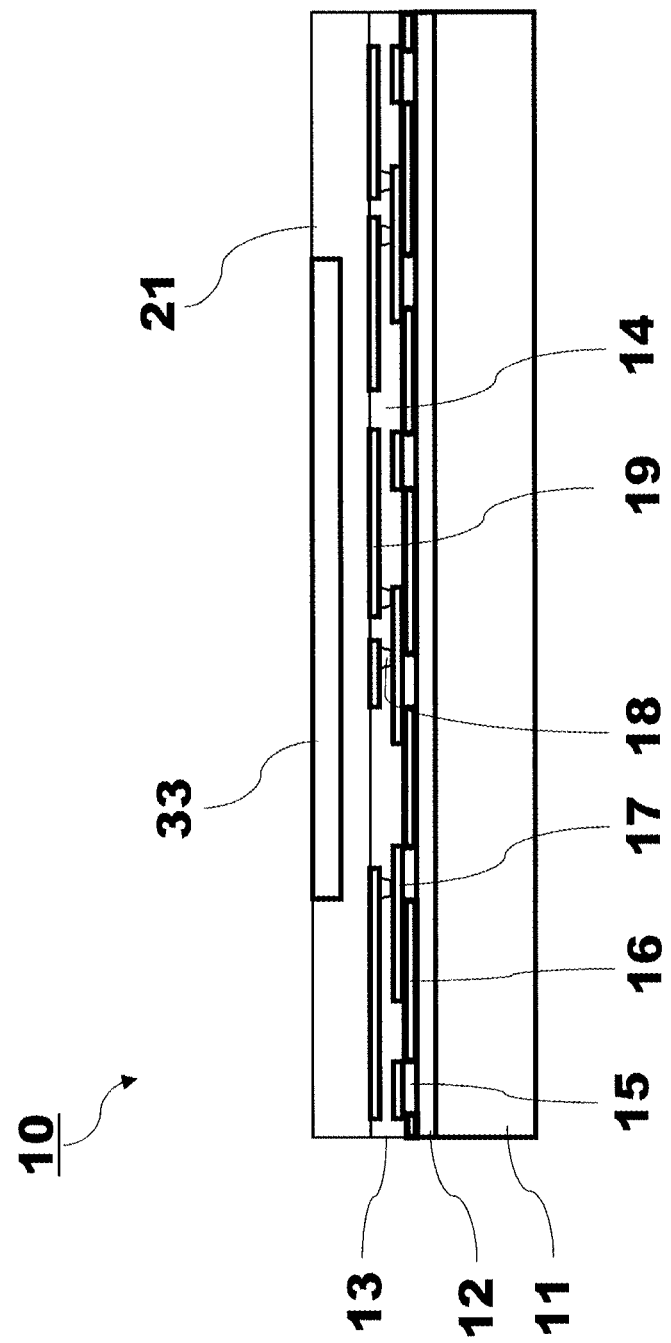
FIG. 1 is a cross sectional view of a semiconductor device (semi-finished product 1) according to an embodiment of the present invention.

Since the formation of embedded pillar in an FOWLP is not easy, the formation of embedded pillar in an FOWLP is not practical. If this is realized by incorporating the existing technologies, the manufacturing cost will increase. The contact resistance between the embedded pillar and the metal wirings in the re-distribution layer may delay signal transmission. Further, the use of the embedded pillars is expected to cause a problem that the relative position accuracy with respect to the semiconductor element is too fine to design.

Accordingly, an object of the present invention is to solve the problems of high cost, signal delay, and design difficulties that occur when trying three-dimensional FOWLP.

Hereinafter, embodiments of an electronic circuit device, a support member of the electronic circuit device, an electronic information terminal, and a method of manufacturing the electronic circuit device according to the present invention will be described by referencing the drawings. Here, an example of a semiconductor device using a semiconductor integrated circuit device such as an application processor chip as an electronic circuit element is shown. The electronic circuit device, support member of the electro circuit device, and the method of manufacturing the electronic circuit device can be implemented in many different ways and is not intended to be construed as being limited to the content of the embodiments described below. In the drawings to be referenced in this embodiment, the same parts are denoted by the same reference numerals, the description of the repetition thereof will be omitted.

Semi-Finished Products (1)

FIG. 1 is a cross sectional view of a semiconductor device 10 according to an embodiment of the present invention. The semiconductor device 10 is a semi-finished product in a dummy wafer or a dummy panel, the left and right ends in the figure are connected to the semiconductor device 10 of the same configuration, and it should be individualized in the subsequent process.

The semiconductor device 10 has a wiring layer 13 including a plurality of copper wiring layers 17 and 19, the photosensitive resin layer 21 formed of a photosensitive resin on the wiring layer 13, and an application processor chip 33 (semiconductor element, first electronic circuit element) arranged in the photosensitive resin layer. Although not shown in the figure, when the semiconductor device 10 is distributed, a protective sheet (coating film) may be mounted over the surfaces of the photosensitive resin layer 21 and the application processor chip 33 for element protection and ray shielding.

Base substrate 11 is a substrate having transparency and rigidity such as glass or plastics. The base substrate 11 is circular or rectangular in 0.5 inches to 12 inches in a planar view. It is typically 12 inches circular. Since application processor chips 33 are rectangular shaped from a few millimeters to a few centimeters square, tens to thousands of application processor chips 33 are packaged simultaneously using a single base substrate 11.

A release layer 12 is formed on the base substrate 11. The material of the release layer 12 includes an adhesive layer and a pure peeling layer. The adhesive layer is formed of a polyethylene terephthalate layer having a thickness of about 10 μm. The pure peeling layer is preferably formed of a polymer compound including a hydroxyl group and a light absorbing group having a thickness of 1 μm or less, typically about 0.3 μm. The total thickness of the release layer 12 is from several μm to several tens μm, typically about 10 μm. The reason that the pure peeling layer is composed of the polymer compound consisting of the hydroxyl group and the light absorbing group is that the peeling is performed later by irradiating a laser beam. The reason for the formation of the adhesive layer is also for protecting the application processor chip 33 from laser beam irradiation.

An insulation layer 16 in which consisted of solder resists or other insulation films is formed on the release layer 12 in contact with the release layer 12. A patterned copper wiring layer 17 is formed on the insulation layer 16. The rear surface of the copper wiring layer 17 and the part where the insulation layer 16 is not present is an electrode pad 15, where a nickel layer or a gold layer may be formed. The copper wiring layer 17 is covered with an insulation film 14. The insulation film 14 includes an insulation material used in the interlayer insulation film of the semiconductor device (e.g., polyimide). A patterned copper wiring layer 19 is formed on the upper layer of the copper wiring layer 17, and the copper wiring layer 17 and the copper wiring layer 19 is connected by a via 18. The via 18 may be any of a photo via that forms a metal layer in an opening that is opened by selectively irradiating ultraviolet ray or a laser via that forms a metal layer in an opening that is opened by selectively irradiating a laser. Via 18 is formed of copper wiring integrally with the copper wiring layer 19.

The copper wiring layer 19 is covered with the insulation film 14 in the same manner as the copper wiring layer 17. The upper surface of the insulation film 14 and the copper wiring layer 19 is flush, and the photosensitive resin layer 21 is formed on this surface. The application processor chip 33 is embedded in the photosensitive resin layer 21. The circuit forming surface of the application processor chip 33 corresponds to the upper surface in the figure, and the circuit forming surface and the photosensitive resin layer 21 are flush with each other.

The total thickness of the release layer 12 and the wiring layer 13 is from 20 μm to 120 μm, typically 50 μm. The thickness of the release layer 12 is 10 μm, the thickness of the insulation layer 16 and the electrode pad is 10 μm, the thickness of the copper wiring layer 17 is 8 μm, the thickness of the copper wiring layer 19 is 10 μm, and the thickness of the insulation film present between the both wiring layer is 15 μm. The pattern widths of the copper wiring layer 17 and the copper wiring layer 19 are from several μm to several tens of μm, but as an example, they are about 25 μm. The thickness of the photosensitive resin layer 21 is 50 μm to 200 μm, typically 90 μm. The semiconductor element is back polished to a thickness of 100 μm or less, typically 70 μm.

Semiconductor device 10 configured as described above, in the form of integrated into the base substrate 11 is stored in the state of a semi-finished product, in some cases will be distributed. Although it is not shown in the figure, when the semiconductor device 10 is distributed, a protective sheet (coating film) may be mounted over the surfaces of the photosensitive resin layer 21 and the application processor chip for element protection and ray shielding. In such semiconductor device 10, via 41/44 with a copper wiring layer that connects the re-distribution layer 42 to the application processor chip 33 or the re-distribution layer 42 and the existing wiring layer 13 described below in three-dimensions, can be easily formed at low cost with photo via without forming a long embedded pillars by plating or the like, and become a part of a member for manufacturing a semiconductor device 40 as a semi-finished product. As will be described later, the semiconductor device 40, which is a semi-finished product of the dummy wafer or panel, becomes a part of a member for manufacturing the three-dimensional FOWLP 60.

As described later, depending on the manufacturing method, a patterned solder resist layer (not shown) may be formed in which the upper surface is flush with the insulation film 14 and the copper wiring layer 19.

Method of Manufacturing the Semi-Finished Product (1) on Dummy Wafer or Dummy Panel The manufacturing processes of the semiconductor device 10 in which is a semi-finished product of the dummy wafer or dummy panel, are shown in FIGS. 5-9.

Figure 5:
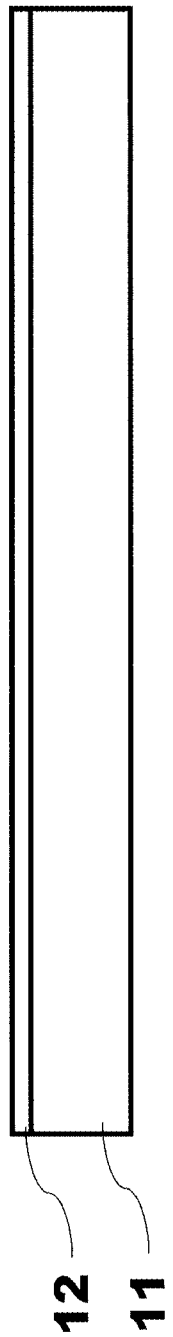
FIG. 5 is a cross sectional view showing a method of manufacturing a semiconductor device (semi-finished product 1) and a support member according to an embodiment of the present invention.
Figure 6:
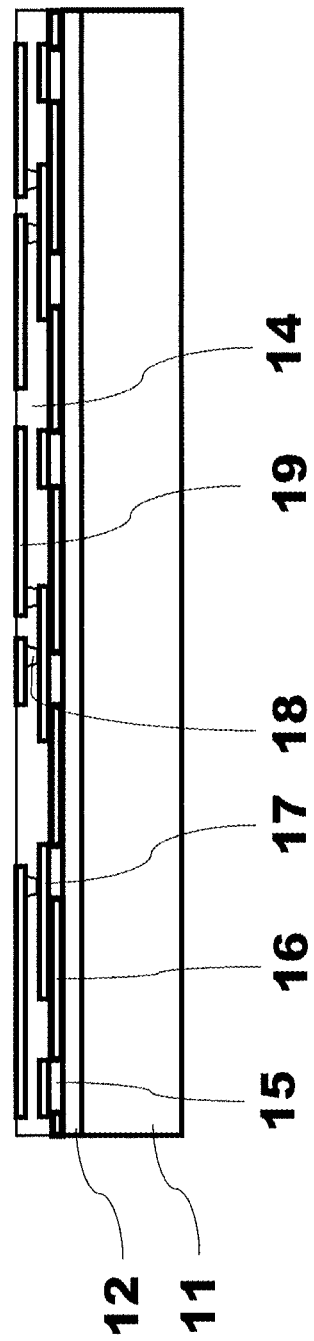
FIG. 6 is a cross sectional view showing a method of manufacturing a semiconductor device (semi-finished product 1) and a support member according to an embodiment of the present invention.
Figure 7:
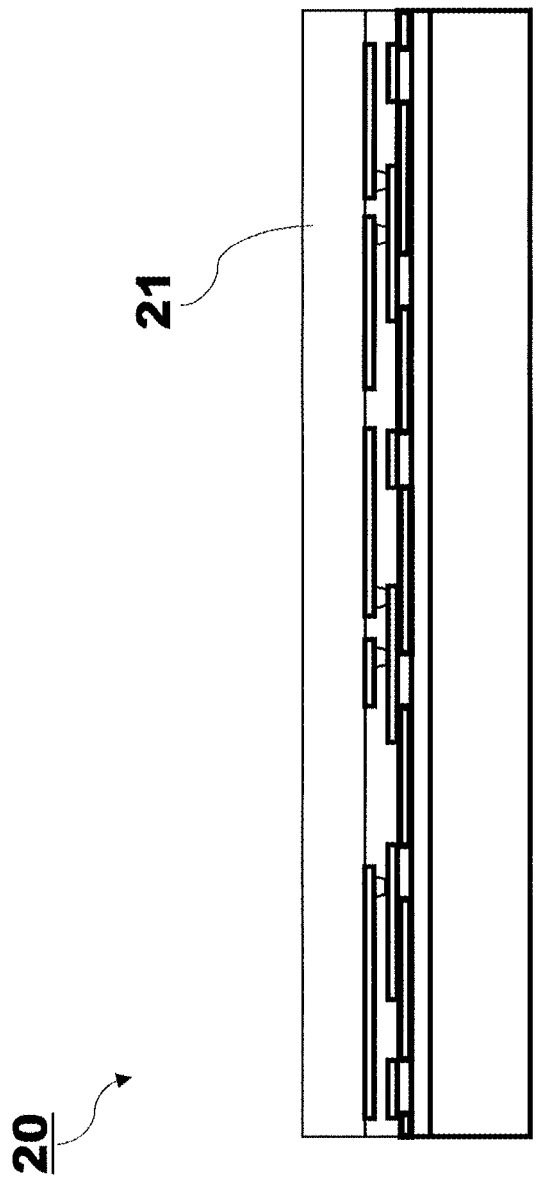
FIG. 7 is a cross sectional view showing a method of manufacturing a semiconductor device (semi-finished product 1) and a support member according to an embodiment of the present invention.

FIGS. 5-7 are cross sectional view showing the semiconductor device according to an embodiment of the present invention (semi-finished product 1 in a dummy wafer or a dummy panel) and the manufacturing method of the first support member 20. The first support member 20 is characterized in that it has a base substrate 11 having transparency such as glass or plastics to be peeled off by laser irradiation or the like in a subsequent step. The first support member 20 includes a release layer 12 formed on the base substrate 11, a wiring layer 13 having a plurality of metal wiring layers (copper wiring layers 17, 19) formed on the release layer 12, and a photosensitive resin layer 21 formed of the photosensitive resin on the wiring layer 13. The first support member 20 may be distributed as a product before (FIG. 6) or after (FIG. 7) the photosensitive resin layer 21 is formed. In this case, the surfaces of the wiring layer 13 or the photosensitive resin layer 21 may be covered with a ray shielding protective sheet (coating film) to protect the elements and prevent degradation of the photosensitivity. The protective sheet may be, for example, an aluminum deposited polystyrene film. Further, the plurality of first support member 20 can be stacked with the interlayer paper in consideration of the adhesion interposed therebetween, and wrapped with the above-described aluminum vapor-deposited polystyrene film wrapping paper having a ray-shielding property before shipping.

Method (1) of Manufacturing the First Support Member

As shown in FIG. 5, a base substrate 11 having transparency and rigidity is prepared. A target mark for stacking in a subsequent step is formed on the surface of the base substrate 11. The target marks are formed by forming a titanium thin film on the entire surface of the base substrate 11 by sputtering and patterning the titanium thin film with an appropriate photolithographic method. The release layer 12 is formed on the base substrate 11. The material of the release layer 12 includes the adhesive layer and the pure peeling layer. The adhesive layer is formed of a polyethylene terephthalate layer having a thickness of about 10 μm. The pure peeling layer is preferably formed of the polymer compound including a hydroxyl group and a light absorbing group having a thickness of 1 μm or less, typically about 0.3 μm. The total thickness of the release layer 12 is from several μm to several tens μm, typically about 10 μm as described above.

As shown in FIG. 6, the wiring layer 13 is formed on the release layer 12, in contact with the release layer 12. The wiring layer is the copper wiring, mainly formed by an etching method or copper plating method to be described later. The pattern of insulation layer 16 is a pattern complementary to electrode pad 15. A patterned copper wiring layer 17 is formed on the electrode pad 15 and the insulation layer 16. Subsequently, the copper wiring layer 17 is covered with the insulation film 14. The material used for the insulation film 14 is generally a photosensitive insulation material (e.g., polyimide). The opening is formed on the insulation film 14. Generally, the opening is formed by photolithographic methods or laser irradiation. The one in which the metal layer is formed in the opening formed by the former is called photo via, and the one in which the metal layer is formed in the opening formed by the latter is called laser via. Furthermore, copper wiring is applied.

Copper wiring layer 17 and 19 are formed by the etching method or a copper plating method.

Methods for forming the copper wiring layers 17 and 19 by the etching methods are as follows. First, a copper thin film is laminated on the entire surface. A photosensitive resist is applied and the photosensitive resist is patterned. The copper wiring layers 17 and 19 are formed by selectively etching and removing a copper thin film using a patterned photosensitive resist as a mask.

Method for forming the copper wiring layers 17 and 19 by copper plating methods are as follows. First, a titanium (Ti)/copper (Cu) laminated thin film are formed on the surface including an electrode pad 15 and the insulation layer 16 (or a surface including the insulation film 14 and the via 18) as a seed of copper plating on the entire surface by sputtering or electroless plating. On top of it, a photosensitive resist is applied to the pattern to expose the wiring region. Subsequently, the copper wiring layer 17 to 19 is formed by seeding titanium (Ti)/copper (Cu) laminated thin film exposed by the photosensitive resist and then peeling the photosensitive resist and etching away the seed layer other than the copper wiring pattern. The method of forming the wiring by the copper plating method is also used for the wiring of the re-distribution layer 42 later.

As shown in FIG. 7, a photosensitive resin layer 21 made of a photosensitive resin is formed on the surface of the copper wiring layer 19 and the insulation film 14 which is flush with each other. The materials of photosensitive resin are not particularly limited. The photosensitive resin is preferably composed of silicone-based resins or soft polymer materials. Since the photosensitive resin is bonded so as to surround the semiconductor chip such as an application processor chip in the process to be described later, the elastic coefficient (Young modulas) should be 1 GPA or less at room temperature and 0.1 GPA or less at 125° C. If the photosensitive resin layer 21 is a silicone-based resin, the elastic coefficient can be set within the above ranges by appropriately adjusting the density and length of the crosslink molecular chains. Since a typical epoxy sealant is several tens of GPAs, a materials having considerably low elastic coefficients is used. As the photosensitive resin layer 21, a known photosensitive resin materials can be used as long as the above condition is satisfied. Embedding of semiconductor chips becomes difficult when the elastic coefficient rises above 1 GPA at room temperature or above 0.1 GPA at 125° C.

The photosensitive resin is preferably exposed at an exposure value of 800 mJ/cm$^2$ or more 2600 mJ/cm$^2$ or less. Alternatively, the photo-crosslinking material of the photosensitive resin or the like is appropriately selected so that the opening 41 can be formed in the step to be described later by the exposure value within the above ranges. Further, the photosensitive resin has the light transmittance of 99.7% at 500 nm, the light transmittance of 99.1% at 450 nm, the light transmittance of 97.6% at 400 nm, the light transmittance of 86.4% at 350 nm, and the light transmittance of 0% at 300 nm. More preferably, the light transmittance of the photosensitive resin at the wavelengths of 350 nm or more is 85% or more. Here, the light transmittance of the photosensitive resin was obtained by forming and curing a resin having a thickness of 15 μm on a glass substrate, and calculating the transmittance from the absorption and transmission of light at each wavelength. If the photosensitive resin is a silicone-based resin, the light transmittance can be set within the above ranges by appropriately adjusting the density and length of the crosslink molecular chains. By setting the exposure value and light transmittance of the photosensitive resin layer 21 and the insulation layer 54 within the above ranges, the opening 41 can be formed in the steps described later.

Method (2) of Manufacturing the First Support Member

The first support member 20 before (FIG. 6) or after (FIG. 7) the photosensitive resin layer 21 is formed can also be manufactured by another methods. First, the base substrate 11 is prepared. The release layer 12 is formed on the base substrate 11. The materials of the release layer 12 include the adhesive layer and the pure peeling layer as previously described.

Subsequently, the separately manufactured wiring layer 13 (typically a separately manufactured circuit substrate) is stacked to the release layer 12. In this case, the insulation layer 16 of the back surface (surface in contact with the release layer 12) of the wiring layer 13 is a solder resist layer. Further, thickness of about 8 μm solder resist layer (not shown) is formed on the surface (the surface opposite to the release layer 12, the surface in contact with the photosensitive resin layer 21) of the wiring layer 13.

Method of Manufacturing the Second Support Member

Figure 8:
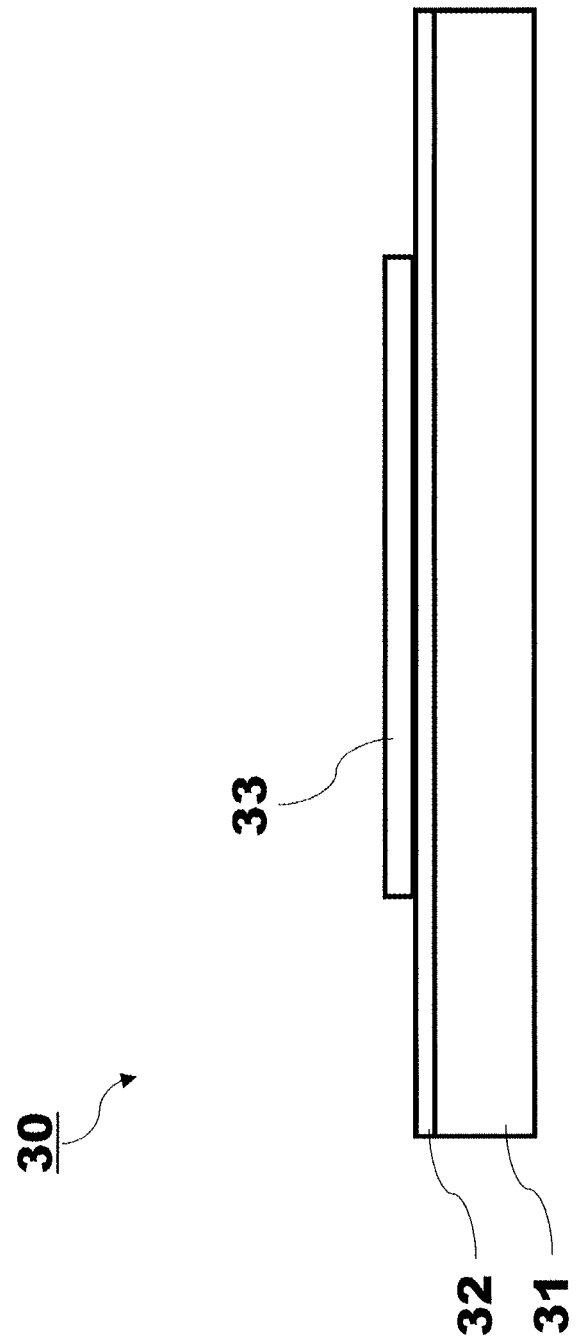
FIG. 8 is a cross sectional view showing a method of manufacturing a semiconductor device (semi-finished product 1) according to an embodiment of the present invention.

FIG. 8 is a cross sectional view showing a method of manufacturing the semiconductor device (semi-finished product 1) and the second support member 30 according to an embodiment of the present invention.

As shown in FIG. 8, a base substrate 31 having rigidity such as metals or glasses is prepared at first. The base substrate 31 does not need to have transparency. Target marks are formed on the surface of the base substrate 31. Target marks are formed by forming a titanium thin film on the entire surface of the base substrate 31 by sputtering and patterning the titanium thin film with appropriate photolithographic method. The adhesive layer 32 is formed on the base substrate 31. As the material of the adhesive layer 32, acrylic resin or epoxy-based resin is used. A semiconductor device, such as the application processor chip 33, is mounted on the adhesive layer 32. Semiconductor elements, such as application processor chips 33, are bonded while detecting the target marks with the circuit-forming surfaces where the electrode pads are exposed facing downward in the figure. In this way, the second support member 30 is formed.

Bonding the First Support Member and the Second Support Member 2

Figure 9:
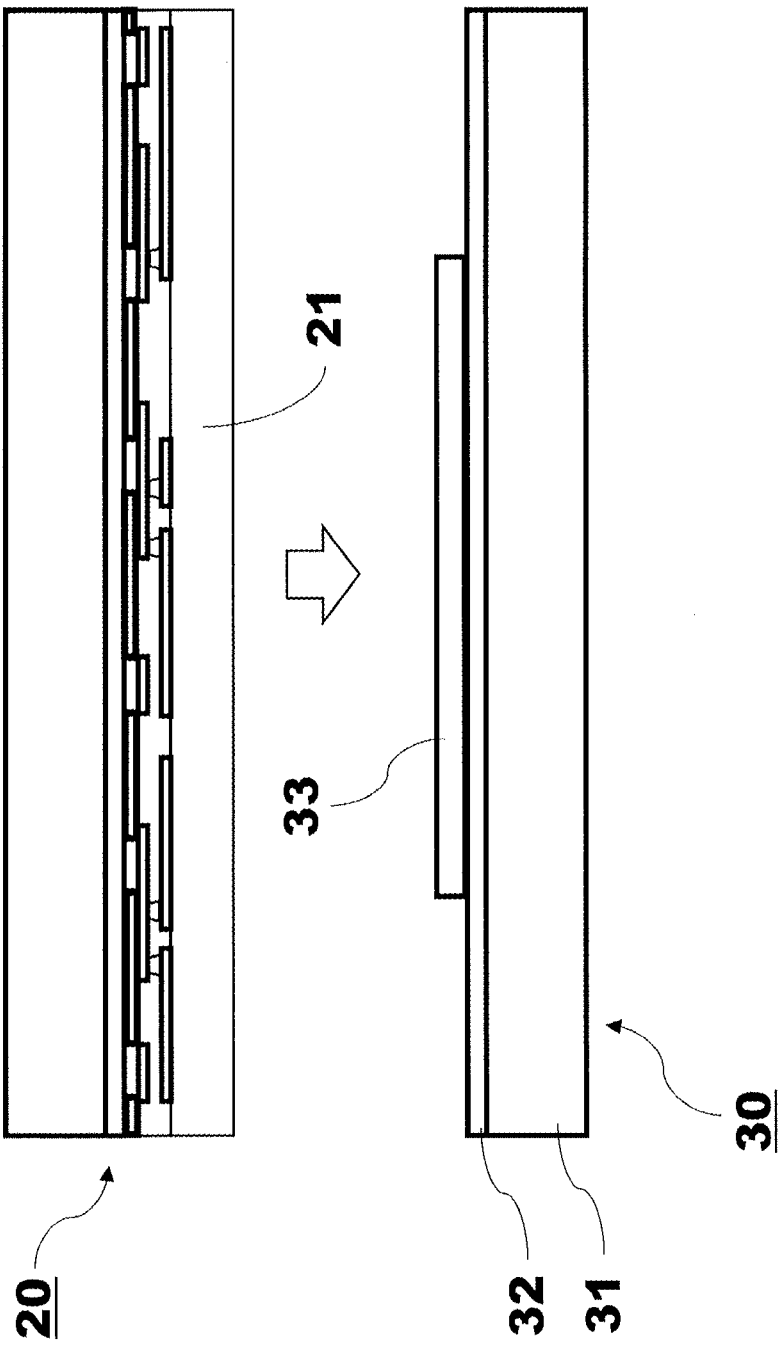
FIG. 9 is a cross sectional view showing a method of manufacturing a semiconductor device (semi-finished product 1) according to an embodiment of the present invention.

As shown in FIG. 9, the first support member 20 and the second support member 30 are stacked together so that the photosensitive resin layer 21 covers a semiconductor device such as the application processor chip 33. At the time of stacking, the target mark on the base substrate 31, the wiring pattern of the copper wiring layer 19 of the first support member 20, and the target mark on the base substrate 11 are detected and accurately bonded. Further, depending on the characteristics of the photosensitive resin layer 21, for example, if the photosensitive resin layer 21 has a thermal curing feature, it is preferable to heat the photosensitive resin layer 21 to about 50° C. to 150° C. Subsequently, the base substrate 31 is peeled from the semiconductor device 10 together with the adhesive layer. In this manner, the semiconductor device 10 which is a semi-finished product of a dummy wafer or a dummy panel having a wiring layer on the back surface side of the semiconductor element shown in FIG. 1 is manufactured.

Semi-Finished Products (2)

Figure 2:
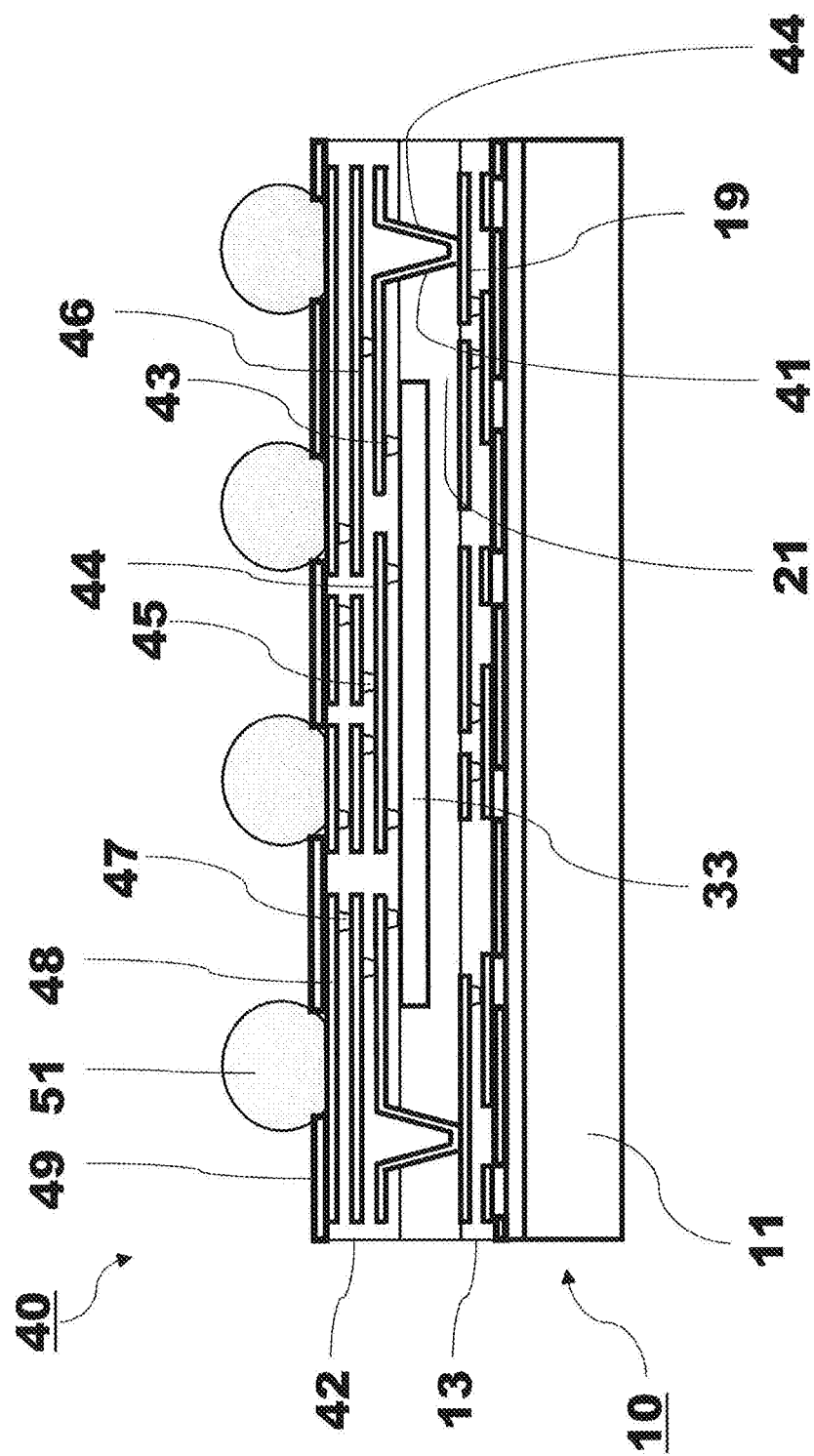
FIG. 2 is a cross sectional view of a semiconductor device (semi-finished product 2) according to an embodiment of the present invention.

FIG. 2 is a cross sectional view of a semiconductor device 40 according to an embodiment of the present invention. The semiconductor device 40 is a semi-finished product in the same dummy wafer or dummy panel as the semiconductor device 10, the left and right end in the figure is connected to the semiconductor device 40 having the same configuration, and it should be individualized in the subsequent process.

In the semiconductor device 40, a plurality of openings 41 exposing a part of the copper wiring layer 19 of the wiring layer 13 are formed in the photosensitive resin layer 21 based on the semiconductor device 10. Further, it is connected to the application processor chip 33 via a copper wiring layer 44 wired on the opening 41, and is three-dimensionally connected to a re-distribution layer 42 formed on the application processor chip 33. The re-distribution layer 42 includes the plurality of copper wiring layer 44, 46, 48 (metal wiring layer), and is connected to a plurality of solder ball 51 (first external connection terminal) connected to the re-distribution layer 42.

The plurality of openings 41 formed in the photosensitive resin layer 21 are formed by selectively irradiating the photosensitive resin and dissolving and removing the resin through a development process, as described later.

As will be described later, via 43 connected to the electrode pad of the application processor chip 33 and via 45, 46 connected to the copper wiring layer 44, 46, 48 are a photo via. The opening of the via 43 is formed in the same process as the opening 41. Therefore, the cross-sectional shape of the opening of the via 43 and the opening 41 has a substantially similar shape.

Semiconductor chips (e.g., the application processor chip 33), a circuit forming surface are arranged with facing the top surface in the figure. Via 43 is formed on the electrode pad. This photo via is formed of copper integrally with the copper wiring layer 44. The copper wiring layer 44 is covered with the insulation film. A patterned copper wiring layer 46 is formed in the upper layer of the copper wiring layer 44. The copper wiring layer 46 is connected to the copper wiring layer 44 through a photo via 45. A patterned copper wiring layer 48 is formed in the upper layer of the copper wiring layer 46. The copper wiring layer 48 is connected to the copper wiring layer 46 through a photo via 47. Via 45, 47 are formed integrally of copper with the copper wiring layer 46, 48.

With the above-described configuration, a part of the electrode pad of the application processor chip 33 is electrically connected to the solder ball 51 via the re-distribution layer 42, while some other electrode pad is electrically connected three-dimensionally to each copper wiring layer in the wiring layer 13 via the copper wiring layer 44 through the opening 41.

The semiconductor device 40 configured as described above is also stored as a semi-finished product in the form of being integrated on the base substrate 11, and may be distributed in some cases. Then, such semiconductor device 40 becomes a part of a member for manufacturing the three-dimensional FOWLP 60.

Method of Manufacturing Semi-Finished Products 2

Figure 10:
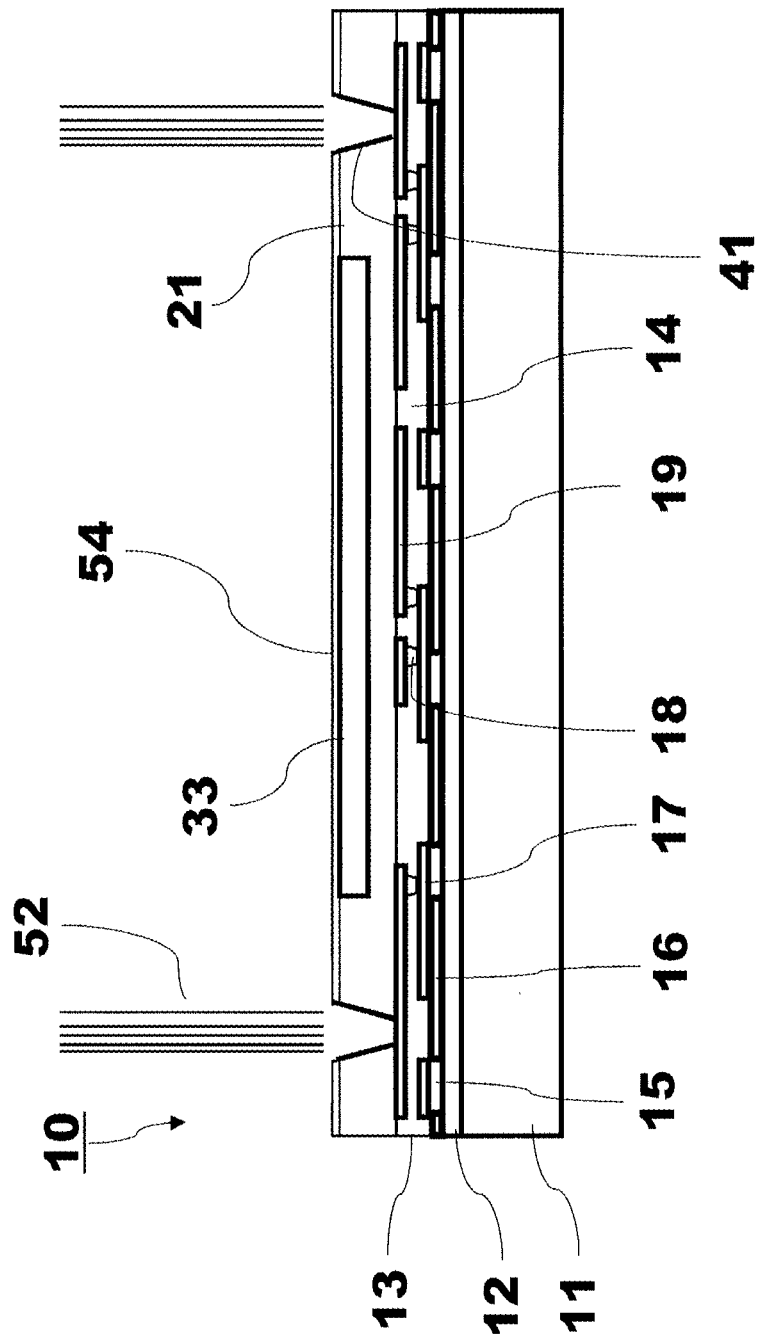
FIG. 10 is a cross sectional view showing a method of manufacturing a semiconductor device (semi-finished product 2) according to an embodiment of the present invention.
Figure 11:
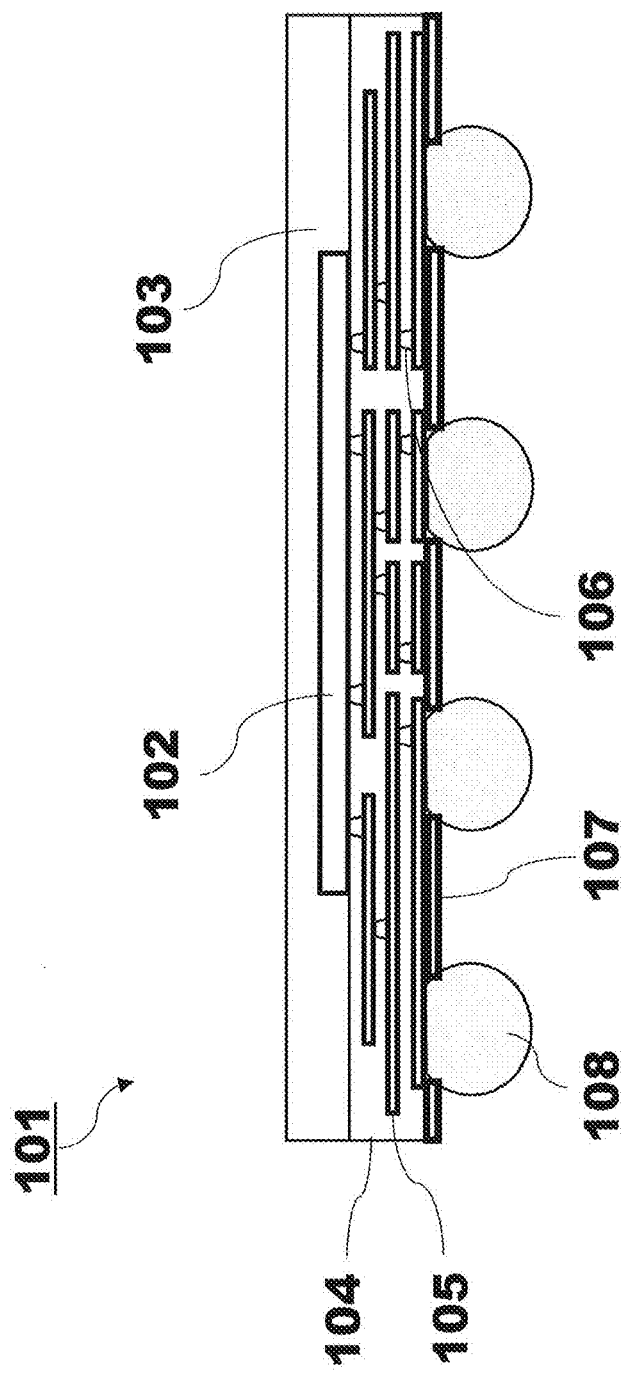
FIG. 11 is a cross sectional view of a FOWLP.

A part of the manufacturing process of the semiconductor device 40 which is a semi-finished product on the dummy wafer or the dummy panel is shown in FIG. 10.

First, an insulation layer 54 is formed on the photosensitive resin layer 21 and the application processor chip of the semi-finished semiconductor device 10. The insulation layer 54 forms a part of the insulation film in the re-distribution layer 42. The insulation layer 54 is also made of the photosensitive resin, and the photosensitive characteristics thereof should be the same as those of the photosensitive characteristics of the photosensitive resin layer 21.

Ultraviolet ray 52 are selectively irradiates to the photosensitive resin layer 21 and the insulation layer 54 from the photosensitive resin layer 21 sides and the insulation layer 54 sides of the semiconductor device 10. Further, through the developing process, the photosensitive resin is dissolved and removed from the opening 41. At this time, an opening is formed almost simultaneously with the insulation layer 54 on the electrode pad of the application processor chip 33 in order to form the via 43. Ultraviolet ray 52 is generated by a metal halide lamp or high pressure mercury lamp, and it is desirable to irradiate selectively scanned the surface of photosensitive resin layer 21 through the movable mirror. If the base substrate 11 is huge and it takes too much time for selective irradiation by scanning, a stencil mask may be used to selectively irradiate the Ultraviolet ray.

A copper re-distribution layer 44 is formed by copper plating methods described above. First, titanium (Ti)/copper (Cu) laminated thin film as a seed of copper plating is formed by sputtering on the entire surface including the insulation layer 54, the opening 41 and the opening for forming via 43. A photosensitive resist is applied thereon and patterned so as to expose the wiring region. Subsequently, copper (Cu) plating is performed using the titanium (Ti)/copper (Cu) laminated thin film exposed by the photosensitive resist as a seed. Thereafter, the photosensitive resist is peeled off, and etching off the seed layer other than the copper wiring pattern to form the copper wiring layer 44. The copper wiring layers 46, 48 and vias 45, 47 of the re-distribution layer 42 are also formed by repeating the same steps as the copper wiring layer 44.

In this manner, the wiring layer 13 and the re-distribution layer 42, and thus the application processor chip 33, can be connected in a low-cost photo via without the use of complicated techniques such as a through pillar or a through electrode, even there is a large distances resulting from the semiconductor chip (the application processor chip 33) sandwiched therebetween.

Figure 3:
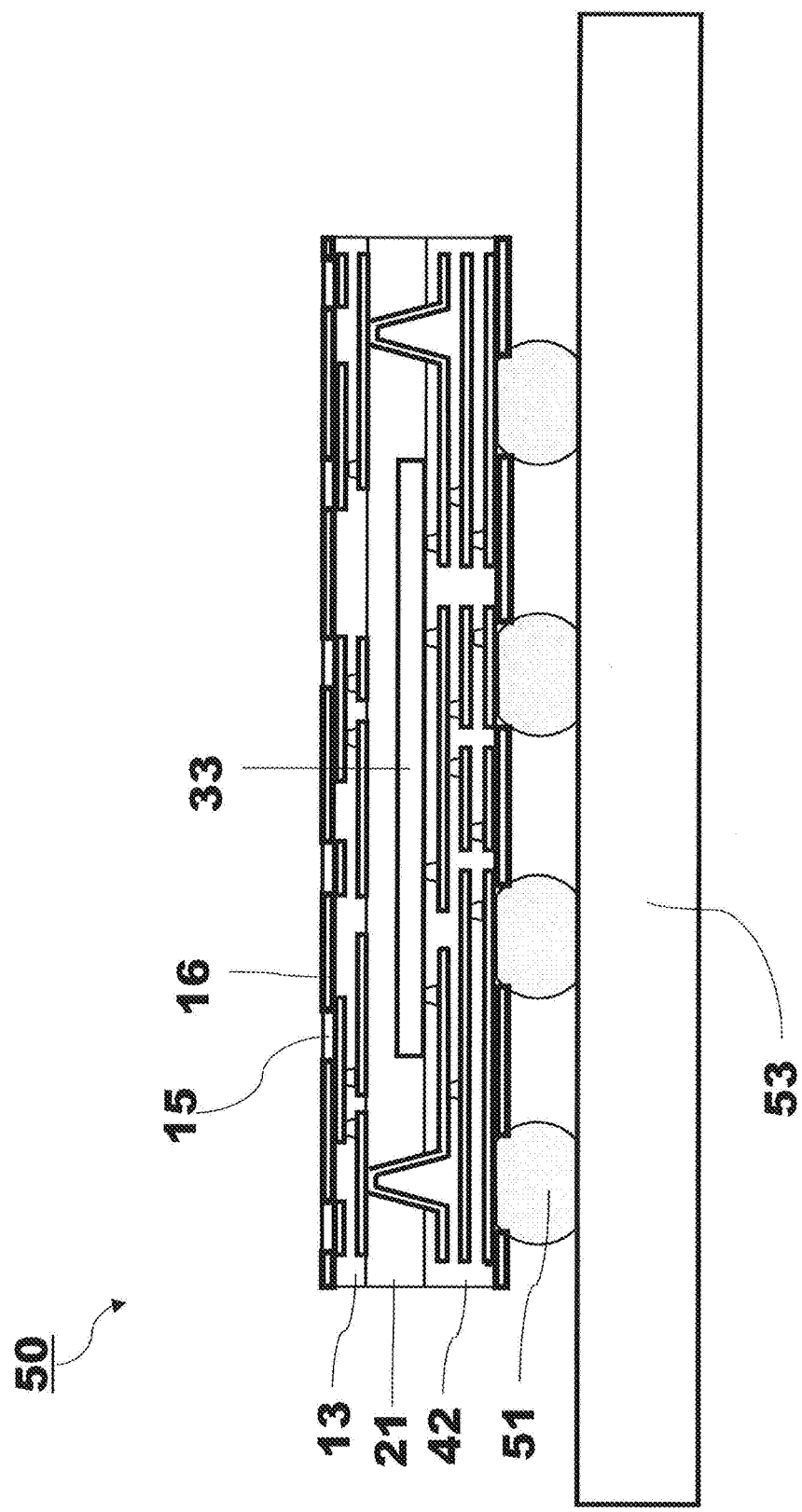
FIG. 3 is a cross sectional view of a semiconductor device (after mounting) according to an embodiment of the present invention.

Mounting of a Semiconductor Device According to an Embodiment of the Present Invention FIG. 3 is a cross sectional view of a state of mounting the semiconductor device to the printed substrate 53 (semiconductor device 50) according to an embodiment of the present invention. In this step, the base substrate 11 of the first support member is peeled by laser irradiation together with the peeling layer. The three-dimensional mounting has not yet been made at this stage. The mounting methods up to this stage are described below.

The semi-finished product 2 shown in FIG. 2 is individualized using a dicing saw. It may be subjected to test steps such as electrical characteristics before the individualization. Even in the individualized condition, the base substrate 11 and the release layer 12 remain bonded. When the base substrate 11 is removed, the semi-finished product 2 is thin so that it is difficult to mount. Therefore, the semi-finished product 2 is characterized in that the base substrate 11 is not peel off until after mounting to the printed substrate 53 or just before mounting the memory 62. The semiconductor device according to an embodiment of the present invention will be stored and distributed in an individualization state.

Mounting to the printed substrate 53 is performed through the following steps. First, the individualized semiconductor device is inverted vertically, mounted on the printed substrate 53. The solder ball 51 is mounted to land on the electrode lands of the printed substrate 53. Subsequently, hot air is blown (reflow process), the solder ball 51 is melted, and electrically connected to the electrode land of the printed substrate 53. Thereafter, the base substrate 11 and the release layer 12 are peeled off.

Figure 4:
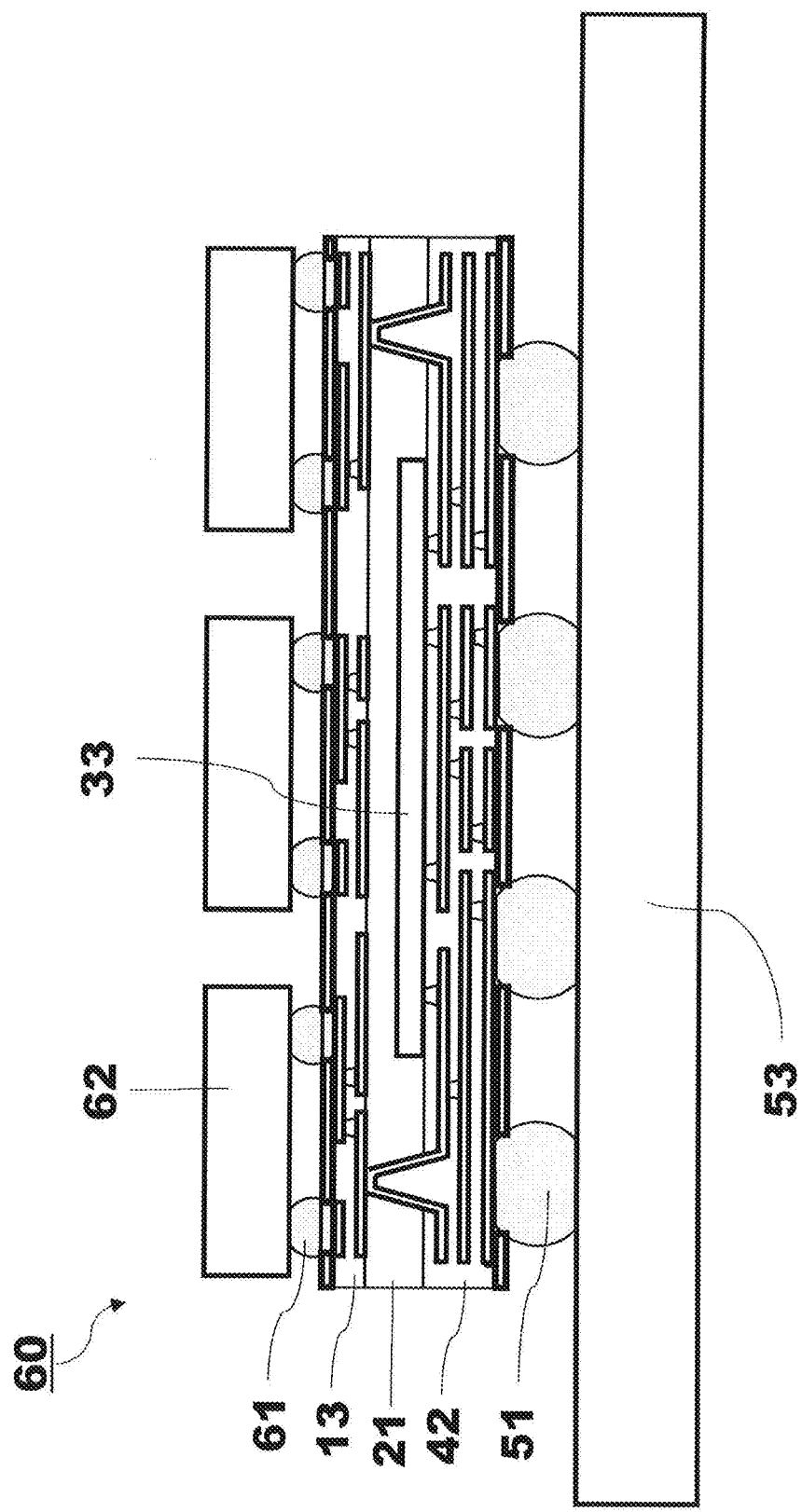
FIG. 4 is a cross sectional view of a three-dimensional semiconductor device (after mounting) according to an embodiment of the present invention.

Three-Dimensional Mounting of a Semiconductor Device According to an Embodiment of the Present Invention FIG. 4 is a cross sectional view of a three-dimensional semiconductor device 60 (after mounting) according to an embodiment of the present invention. Implementation methods up to this stage are described below.

In the state shown in FIG. 3, the solder ball 51 is covered with an underfill (not shown). The underfill is an epoxy resin having a high fluidity. When the epoxy resin is dropped in the vicinity of the individualized semiconductor device, the epoxy resin flows between the printed circuit board 53 and the re-distribution layer 42 by a capillary phenomenon. In this manner, the solder ball 51 is covered with an underfill.

Subsequently, a memory 62 (a second electronic circuit element), such as the DRAM or flash memory, to exchange signals with the application processor chip 33 with a predetermined data widths are prepared. These memories 62 are ball grid array (BGA) packages and there are large number of the solder ball 61 (second external connection terminal). The memory 62 is mounted so that the solder ball 61 lands on the electrode pad 15 of the semiconductor device 50. Subsequently, hot air is blown (reflow process) to melt the solder ball 61, and electrically connected to the electrode pad 15. The underfill described above can prevent damage to the solder ball 51 in the reflow process.

Second Three-Dimensional Mounting of a Semiconductor Device According to an Embodiment of the Present Invention In FIG. 4, it is also possible to mount the memory 62 on the pad 15 before mounting it on the printed substrate 53 to produce the three-dimensional product, and then mount it on the printed substrate 53 as a three-dimensional FOWLP. In this case, the semiconductor device 40 is temporarily fixed to a substrate or the like, and the base substrate 11 of the first support member is separated together with the release layer by laser irradiation. Memory 62 electrically connects to pad 15 via solder ball 61. Between the memories 62 and the wiring layer 13, the solder ball 61 may be covered with an underfill (not shown). Semiconductor devices 60 before mounting to printed substrate 53 will be tested and distributed as three-dimensional FOWLP products.

As a result, the three-dimensional mounting application processor chip 33 and memory 62 are electrically connected in wide bandwidth and also connected to a printed substrate.

As described above, the semiconductor device according to an embodiment of the present invention enables three-dimensional mounting in the FOWLP. The method is low in cost, and solves the problems of speeding up and design difficulties.

Electronic Information Terminal According to an Embodiment of the Present Invention The electronic information terminal (including but not limited to a mobile phone, a smartphone terminal, a tablet terminal, etc.) according to an embodiment of the present invention includes a three-dimensional semiconductor device 60 mounted on the printed substrate 53. The application processor chip 33 and the memory 62, such as a DRAM or flash memory, allow large amounts of data communication over a wide range of data buses. In one embodiment of the present invention, it is possible to reduce the mounting area of each semiconductor chip, an extremely small electronic information terminal is realized.

Modification of the Embodiment of the Present Invention

In one embodiment of the present invention, an example of the three-dimensional mounting of an application processor chip and DRAM or flash memory is shown. However, the electronic circuit element is not limited thereto, and other logic LSI or memory element may be mounted instead of the application processor chip, or other logic LSI or memory element may be mounted instead of a DRAM or flash memory. These electronic circuit element need not be limited to the semiconductor device, but may be elements that can be various components of electronic circuits, such as passive elements, sensor elements, magnetic devices, and antennas.

In one embodiment of the present invention, a configuration for stacking a semiconductor device in two layers is shown in FIG. 4 as an example of a three-dimensional mounting, but it is not limited to this, the semiconductor device shown in FIG. 2 and FIG. 3 may be stacked in three or more layers. This makes it possible to mount a higher density.

Effect of the Invention

According to the present invention, it is possible to solve the problems of high cost, inhibition of high-speed operation, and difficulty in designing, which occur when considering three-dimensional FOWLP.

What is claimed is:

1. A method of manufacturing an electronic circuit device, the method comprising:
preparing a first support member having a wiring layer including a plurality of wirings and a plurality of connection terminals arranged at a predetermined position on a bottom layer of the wiring layer, and a photosensitive resin layer formed on the bottom layer of the wiring layer, the photosensitive resin layer being made from insulating photosensitive resin, an elastic modulus of the photosensitive resin layer is 1 GPA or less at room temperature;
preparing a second support member having a first base substrate, and a first electronic circuit element having a first surface on which a connection terminal is formed, the first surface of the electronic circuit element being mounted on the first base substrate via a peelable adhesive layer;
laminating the first support member and the second support member so that the photosensitive resin layer covers a second surface opposite to the first surface of the first electronic circuit element and a side surface of the first electronic circuit element, the photosensitive resin to be laminated in 50 to 150° C. temperature;
peeling the first base substrate to expose the first surface;
forming an insulating layer with an insulating photosensitive resin having a same or similar photosensitive characteristics as the photosensitive resin so as to cover the first surface of the first electronic circuit element and the photosensitive resin layer exposed by the peeling;
forming a plurality of photolithographic via holes having different depths with respect to the connection terminal of the first electronic circuit element and the connection terminal of the wiring layer simultaneously, by exposing a predetermined position of the insulating layer; and
metallizing the plurality of photolithographic via holes and a predetermined wiring pattern on the surface of the insulating layer.

2. The method of manufacturing an electronic circuit device according to claim 1, the method further comprising:
forming a re-distribution layer by repeated forming an insulating film being made from insulating photosensitive resin so as to be stacked on the metallized insulating layer, and forming a plurality of connection vias and a metal wiring by repeating exposure and metallizing for the insulating film; and
forming a plurality of external connection terminals connected on a top layer of the re-distribution layer.

3. The method of manufacturing an electronic circuit device according to claim 2, wherein;
the wiring layer of the first support member is stacked on a second base substrate via a peeling layer, and
the second base substrate of the first support member is peeled and removed after the plurality of external connection terminals of the re-distribution layer are formed.

4. The method of manufacturing an electronic circuit device according to claim 3, the method further comprising:
mounting a second electronic circuit element connected to the wiring layer by the external connection terminals.

5. The method of manufacturing an electronic circuit device according to claim 1, wherein;
an elastic modulus of the photosensitive resin layer is 0.1 GPA or less at 125° C.

6. The method of manufacturing an electronic circuit device according to claim 1, wherein;
the forming the plurality of photolithographic via holes by exposure includes exposing at a dose of 800 mJ/cm$^2$ or more and 2600 mJ/cm$^2$ or less.

7. The method of manufacturing an electronic circuit device according to claim 1, wherein;
the photosensitive resin layer has a light transmittance of 85% or more at 350 nm or more wavelength, the transmittance is calculated from absorption/transmission of light at each wavelength when a 15 μm-thick photosensitive resin is formed and cured on a glass substrate.

8. The method of manufacturing an electronic circuit device according to claim 7, wherein;
the photosensitive resin layer has a light transmittance of 99.7% at 500 nm, 99.1% at 450 nm, 97.6% at 400 nm, 86.4% at 350 nm, and 0% at 300 nm.

9. A method of manufacturing an electronic circuit device, the method comprising:
preparing a first support member having a wiring layer including a plurality of wirings and a plurality of connection terminals arranged at a predetermined position on a bottom layer of the wiring layer, and a photosensitive resin layer formed on the bottom layer of the wiring layer, the photosensitive resin layer being made from insulating photosensitive resin;
preparing a second support member having a first base substrate, and a first electronic circuit element having a connection terminal, the connection terminal of the electronic circuit element being mounted on the first base substrate via a peelable adhesive layer;
stacking the first support member and the second support member so that the photosensitive resin layer covers the first electronic circuit element;
peeling the first base substrate;
forming an insulating layer with an insulating photosensitive resin having a same or similar photosensitive characteristics as the photosensitive resin so as to cover the connection terminal of the first electronic circuit element and the photosensitive resin layer exposed by the peeling;

forming a plurality of photolithographic via holes having different depths with respect to the connection terminals of the first electronic circuit element and the connection terminals of the wiring layer simultaneously, by exposing a predetermined position of the insulating layer;

metallizing the plurality of photolithographic via holes and a predetermined wiring pattern on the surface of the insulating layer;

forming a re-distribution layer by repeated forming an insulating film being made from insulating photosensitive resin so as to be stacked on the metallizing insulating layer, and forming a plurality of connection vias and a metal wiring by repeating exposure and metallizing for the insulating film; and forming a plurality of external connection terminals connected on a top layer of the re-distribution layer.

10. The method of manufacturing an electronic circuit device according to claim 9, wherein;

the wiring layer of the first support member is stacked on a second base substrate via a peeling layer, and the second base substrate of the first support member is peeled and removed after the plurality of external connection terminals of the re-distribution layer are formed.

11. The method of manufacturing an electronic circuit device according to claim 10, the method further comprising:

mounting a second electronic circuit element connected to the wiring layer by the external connection terminals.

12. The method of manufacturing an electronic circuit device according to claim 9, wherein;

an elastic modulus of the photosensitive resin layer is 1 GPA or less at room temperature and 0.1 GPA or less at 125° C.

13. The method of manufacturing an electronic circuit device according to claim 9, wherein;

the forming the plurality of photolithographic via holes by exposure includes exposing at a dose of 800 mJ/cm$^2$ or more and 2600 mJ/cm$^2$ or less.

14. The method of manufacturing an electronic circuit device according to claim 9, wherein;

the photosensitive resin layer has a light transmittance of 85% or more at 350 nm or more wavelength, the transmittance is calculated from absorption/transmission of light at each wavelength when a 15 μm-thick photosensitive resin is formed and cured on a glass substrate.

15. The method of manufacturing an electronic circuit device according to claim 14, wherein;

the photosensitive resin layer has a light transmittance of 99.7% at 500 nm, 99.1% at 450 nm, 97.6% at 400 nm, 86.4% at 350 nm, and 0% at 300 nm.

16. A method of manufacturing an electronic circuit device, the method comprising:

preparing a first support member having a wiring layer including a plurality of wirings and a plurality of connection terminals arranged at a predetermined position on a bottom layer of the wiring layer, and a photosensitive resin layer formed on the bottom layer of the wiring layer, the photosensitive resin layer being made from insulating photosensitive resin;

preparing a second support member having a first base substrate, and a first electronic circuit element having a connection terminal, the connection terminal of the electronic circuit element being mounted on the first base substrate via a peelable adhesive layer;

stacking the first support member and the second support member so that the photosensitive resin layer covers the first electronic circuit element;

peeling the first base substrate;

forming an insulating layer with an insulating photosensitive resin having a same or similar photosensitive characteristics as the photosensitive resin so as to cover the connection terminal of the first electronic circuit element and the photosensitive resin layer exposed by the peeling;

forming a plurality of photolithographic via holes having different depths with respect to the connection terminal of the first electronic circuit element and the connection terminals of the wiring layer simultaneously, by exposing a predetermined position of the insulating layer; and metallizing the plurality of photolithographic via holes and a predetermined wiring pattern on the surface of the insulating layer, wherein the photosensitive resin layer has a light transmittance of 85% or more at 350 nm or more wavelength, the transmittance is calculated from absorption and/or transmission of light at each wavelength when a 15 μm-thick photosensitive resin is formed and cured on a glass substrate.

17. The method of manufacturing an electronic circuit device according to claim 16, wherein;

the photosensitive resin layer has a light transmittance of 99.7% at 500 nm, 99.1% at 450 nm, 97.6% at 400 nm, 86.4% at 350 nm, and 0% at 300 nm.

\* \* \* \* \*